United States Patent
Yip et al.

(10) Patent No.: US 11,094,357 B2
(45) Date of Patent: Aug. 17, 2021

(54) MEMORY DEVICES WITH USER-DEFINED TAGGING MECHANISM

(71) Applicant: Micron Technology, Inc., Boise, ID (US)

(72) Inventors: Aaron S. Yip, Los Gatos, CA (US); Theodore T. Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/405,072

(22) Filed: May 7, 2019

(65) Prior Publication Data

US 2020/0357448 A1    Nov. 12, 2020

(51) Int. Cl.
| | |
|---|---|
| *G11C 16/06* | (2006.01) |
| *G11C 8/08* | (2006.01) |
| *G11C 16/26* | (2006.01) |
| *G11C 16/08* | (2006.01) |
| *G11C 16/04* | (2006.01) |

(52) U.S. Cl.
CPC ............ *G11C 8/08* (2013.01); *G11C 16/0483* (2013.01); *G11C 16/08* (2013.01); *G11C 16/26* (2013.01)

(58) Field of Classification Search
CPC ..................................................... G11C 29/88
USPC .......................................................... 365/200
See application file for complete search history.

(56) References Cited

U.S. PATENT DOCUMENTS

| | | | | |
|---|---|---|---|---|
| 5,835,436 | A * | 11/1998 | Ooishi | G11C 7/10 365/230.03 |
| 7,529,969 | B1 * | 5/2009 | Patel | G06F 11/1068 714/6.1 |
| 7,675,776 | B2 * | 3/2010 | Allen | G11C 29/76 365/185.09 |
| 2008/0031061 | A1 * | 2/2008 | Roohparvar | G11C 29/88 365/200 |
| 2009/0273984 | A1 | 11/2009 | Tanzawa | |
| 2016/0064452 | A1 * | 3/2016 | Ueda | G11C 13/004 365/148 |
| 2016/0232985 | A1 * | 8/2016 | Sabde | G11C 29/025 |

* cited by examiner

*Primary Examiner* — Min Huang
(74) *Attorney, Agent, or Firm* — Perkins Coie LLP

(57) ABSTRACT

A memory device includes a memory array with memory blocks each having a plurality of memory cells, and one or more current monitors configured to measure current during post-deployment operation of the memory device; and a controller configured to identify a bad block within the memory blocks based on the measured current, and disable the bad block for preventing access thereof during subsequent operations of the memory device.

20 Claims, 4 Drawing Sheets

MEMORY DEVICES WITH USER-DEFINED TAGGING MECHANISM

TECHNICAL FIELD

The disclosed embodiments relate to apparatus, and, in particular, to memory apparatus with a user-defined tagging mechanism for memory blocks.

BACKGROUND

Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), resistive random access memory (RRAM), and magnetic random access memory (MRAM), among others.

In some embodiments, the memory devices include circuit units (e.g., transistors and/or memory cells) configured to store levels of charges that represent different values. Accordingly, the memory devices can store and access various information via the circuit units. In one or more embodiments, the circuit units are configured or connected (via, e.g., word-lines, bit-lines, etc.) to form larger groupings, such as pages, blocks, etc. During operation, the circuit units are often accessed, such as during writes or reads, according to the larger groupings.

Since the information is processed according to such larger groupings (e.g., memory blocks), defects in one or more circuit units therein can negatively impact the performance of the overall grouping. Because such defects occur during manufacturing and/or due to repeated usage (i.e., wear), some of the memory groupings may become unusable. In view of the ever-increasing commercial competitive pressures, along with growing consumer expectations and the desire to differentiate products in the marketplace, it is increasingly desirable that answers be found to these problems.

DETAILED DESCRIPTION

As described in greater detail below, the technology disclosed herein relates to memory devices, systems with memory devices, and related methods for dynamically allowing a user to tag bad memory blocks. The tagged blocks can be disabled such that they are removed from usage without the possibility of the user overriding the tag.

Memory blocks can be considered "bad" when they fail to correctly retain data and/or reproduce stored data. For example, a dioxide layer that is intended to retain the charges may have defects resulting from production/manufacturing errors and/or from repeated usage/access over time. Accordingly, the corresponding memory cell(s) may fail to retain the correct level of charges and/or effectively cause an unintended electrical path (e.g., a short).

In conventional devices, bad blocks are identified during production testing, and the results of this identification are stored in the array. Once the devices are deployed (e.g., implemented for intended use, such as by an end user and/or for assembly of a different device/system), the devices can access the stored results and render the identified bad blocks inaccessible. For example, the devices can set the bad blocks' disable latch and/or the block select signals for the bad blocks can be grounded. In some embodiments, the block select signals can be permanently (i.e., irreversible during the life of the device) connected to ground for the bad blocks. Accordingly, the user cannot read, write or erase these blocks, thereby preventing the bad blocks from inadvertently interfering with healthy blocks. Since the bad blocks are identified during production testing, memory blocks that degrade and become bad after deployment do not get the benefit of such tagging.

In comparison to the conventional devices, the embodiments described below are configured to identify and disable (via, e.g., disconnecting from corresponding word lines and/or other circuits) the blocks that go bad after/during deployment of the memory devices. Since merely identifying the bad blocks allows for the possibility of the users inadvertently accessing them (e.g., due to user errors), the embodiments described below can allow the users to tag the bad memory blocks with tags stored in a predetermined block (e.g., that is different from the read-only-memory (ROM) block and/or the tag storage block where the tags resulting from the production testing are stored). Accordingly, the memory blocks that degrade and go bad after deployment can be disabled by the user such that they do not interfere with normal operations of the memory device.

Figure 1:
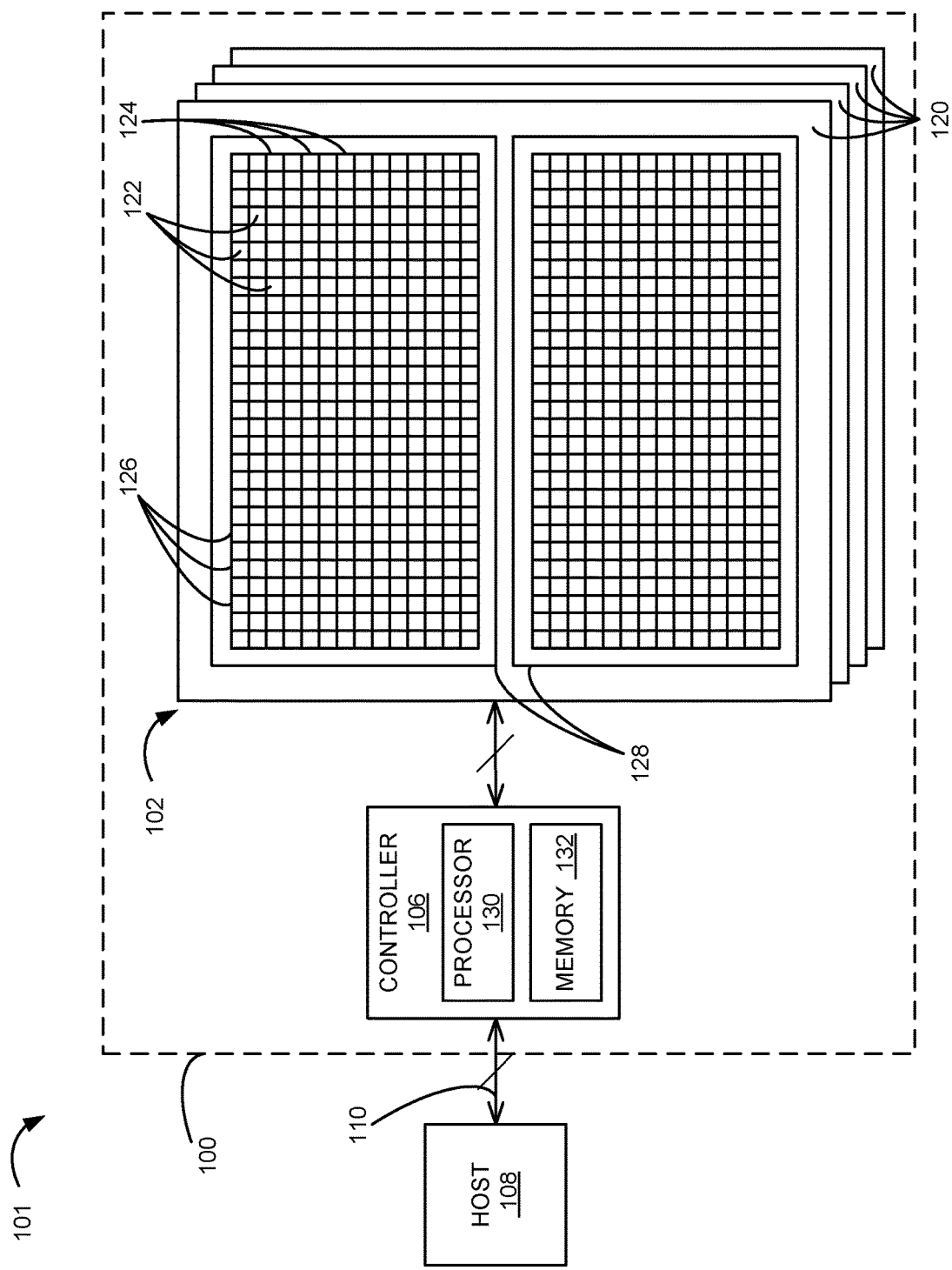
FIG. 1 is a block diagram of a memory system configured in accordance with an embodiment of the present technology.

FIG. 1 is a block diagram of a system 101 having a memory device 100 configured in accordance with an embodiment of the present technology. As shown, the memory device 100 includes a main memory 102 (e.g., NAND flash, NOR flash, chalcogenide PCM, etc.) and a controller 106 operably coupling the main memory 102 to a host device 108 (e.g., an upstream central processor (CPU)). The main memory 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory cells 122 can include, for example, floating gate, charge trap, phase change, ferroelectric, magnetoresistive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Each word line can include one or more memory pages, depending upon the number of data states the memory cells 122 of that word line are configured to store. For example, a single word line of memory cells 122 in which each memory cell 122 is configured to store one of two data states (e.g., SLC memory cells configured to store one bit each) can include a single memory page. Alternatively, a single word line of memory cells 122 in which each memory cell 122 is configured to store one of four data states (e.g., MLC memory cells configured to store two bits each) can include two memory pages. Moreover, memory pages can be interleaved so that a word line comprised of memory cells 122 in which each memory cell 122 is configured to store one of two data states (e.g., SLC memory cells) can span two memory pages, in an "even-odd bit line architecture," where all the memory cells 122 in odd-numbered columns 126 of a single word line are grouped as a first memory page, and all the memory cells 122 in even-numbered columns 126 of the same word line are grouped as a second memory page. When even-odd bit line architecture is utilized in a word line of memory cells 122 in which each memory cell 122 is configured to store larger numbers of data states (e.g., memory cells configured as MLC, TLC, QLC, etc.), the number of memory pages per word line can be even higher (e.g., 4, 6, 8, etc.).

Each column 126 can include a string of series-coupled memory cells 122 connected to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 100 can include only one memory unit 120. Alternatively, the memory device 100 can include 2, 3, 4, 8, 10, or more (e.g., 16, 32, 64, or more) memory units 120. Although the memory units 120 are shown in FIG. 1 as including two memory blocks 128 each, in other embodiments, each memory unit 120 can include 1, 3, 4, 8, or more (e.g., 16, 32, 64, 100, 128, 256, or more memory blocks). In some embodiments, each memory block 128 can include, for example, $2^{15}$ memory pages, and each memory page within a block can include, for example, $2^{12}$ memory cells 122 (e.g., a "4k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory device 100, including managing the main memory 102 and handling communications between the memory device 100 and the host device 108. In some embodiments, the embedded memory 132 can include memory registers storing, for example, memory pointers, fetched data, etc. The embedded memory 132 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 1, a memory device 100 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the main memory 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 1).

The controller 106 communicates with the host device 108 over a host-device interface 110. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 108 can be any one of a number of electronic devices capable of utilizing memory for the temporary or persistent storage of information, or a component thereof. For example, host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 108 may be a networking device (e.g., a switch, a router, etc.) or a recorder of digital images, audio and/or video, a vehicle, an appliance, a toy, or any one of a number of other products. In one embodiment, host device 108 may be connected directly to memory device 100, although in other embodiments, host device 108 may be indirectly connected to memory device 100 (e.g., over a networked connection or through intermediary devices).

Figure 2:
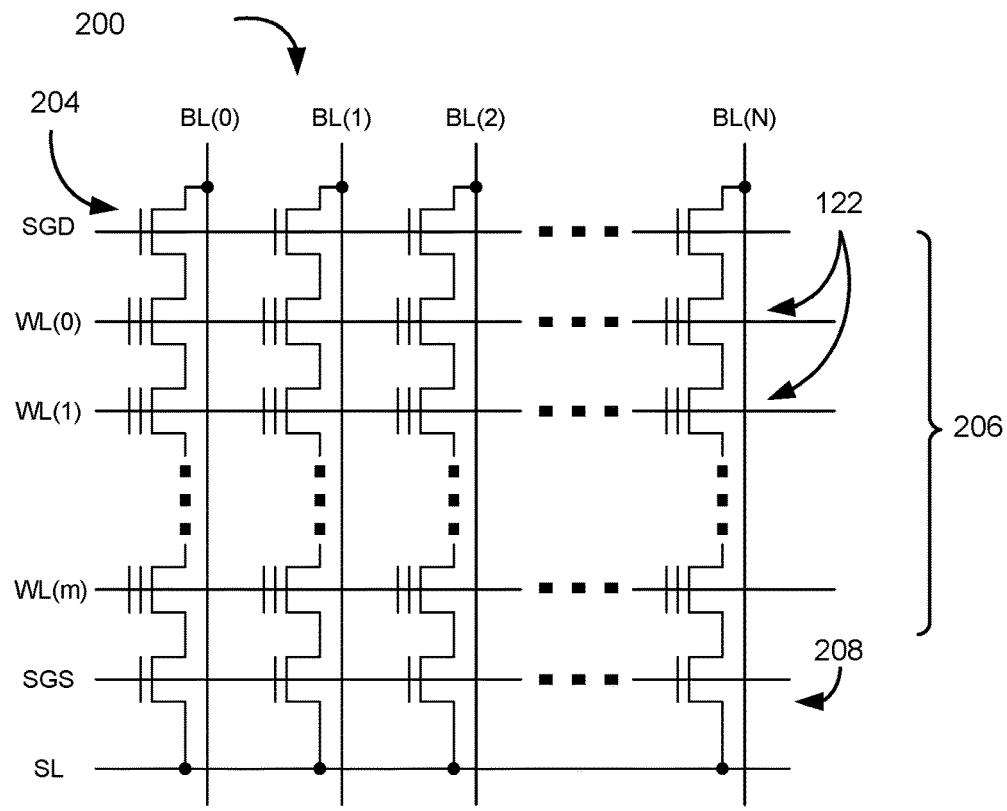
FIG. 2 is an example circuit diagram of a memory array in accordance with an embodiment of the present technology.

FIG. 2 is an example circuit diagram of a memory array 200 (e.g., a set of the memory units 120, such as a NAND flash memory array) in accordance with an embodiment of the present technology. As described above, the memory array 200 includes the memory cells 122 (e.g., floating gate transistors) arranged according to word lines (e.g., horizontal rows of the memory cells 122) and bit lines (e.g., vertical columns of the memory cells 122). As illustrated in FIG. 2, the memory array 200 can include word lines WL(0)-WL (M) and bit lines BL(0)-BL(N).

As described above, the memory cells 122 can be configured to retain various levels/amounts of charges that represent different data states or values. For example, the memory cells 122 can include floating gate transistors that store the charges within insulative layers (e.g., oxide layers), and the stored charge levels can be varied via tunneling operations.

To access the memory cells 122 and/or the information stored therein, a row decoder (not shown) and a column decoder (not shown) can be provided. The row decoder and the column decoder can be configured to receive (via, e.g., the host-device interface 110 of FIG. 1, such as an address bus) information from the host 108 of FIG. 1 and translate the address for accessing a particular memory cell in the memory array 200. In accessing/reading the memory cells 122, the memory device 100 can include a row driver (not shown) configured to activate a selected word line according to the address. A sense amplifier block (not shown), having a plurality of the sense amplifiers, can be provided inline with the column decoder and the memory array 200. The sense amplifier block can be configured to sense and amplify individual values stored in the memory cells 122.

Since the memory cells 122 may rely on insulative structures to hold the stored information, the ability of the memory cells 122 to retain the stored charges break down when the insulative structures degrade. The degradation of the insulative layers may occur during production (e.g., during assembly and/or packaging operations) and/or after deployment (e.g., due to usage of the memory device 100). For example, high temperatures used during assembly and packaging of the NAND dies can trigger physical changes that can lead to the defects. Also, high temperatures and/or wear due to repeated reads/writes over time during operation of the memory device 100 can lead to the defects. When severe, such degradations can effectively create shorts or paths to ground through the memory cells 122.

Traditional devices test for bad memory blocks that include the defective memory cells during manufacturing. The discovered bad blocks are then disabled (via, e.g., storing the corresponding block addresses in a predetermined block) before the memory device 100 finishes the manufacturing process. However, traditional devices lack the capacity to similarly disable memory blocks that become bad (e.g., due to later-developed defects in the insulative layers in one or more memory cells therein) after deployment and/or during intended operation of the memory device 100.

Further complicating the issue, operational impacts caused by bad memory blocks may be amplified by other features/operations of the memory device 100. In some embodiments, for example, the memory device 100 can be configured to bias the word lines, such as with voltage levels less than read/write levels, when the memory array 200 is in standby mode. In other words, the memory device 100 can apply a predetermined voltage level to the word lines between functional (e.g., read, write, erase, etc.) operations. For example, the memory device 100 can bias the word lines (e.g., horizontal/row connections as illustrated in FIG. 2) to about 2V when the word lines are not activated for read operations and/or write operations to provide improved reliability (e.g., by reducing leakage currents across access transistors). Also, biasing the word lines can improve a response time for reading/writing the information with respect to the memory cells 122. However, bad blocks that are not disabled will increase the current draw during this biasing operation and interfere with normal operations (e.g., operations of other healthy memory blocks) of the memory device 100. As such, identifying and disabling bad blocks that form after deployment reduces and/or eliminates negative impacts when the word lines are biased, such as by reducing/eliminating effective shorts between word lines and ground through the bad blocks. Accordingly, identifying and disabling bad blocks reduces/eliminates the bad blocks from interfering with normal operations, such as by reducing the leakage currents and preventing violations of one or more operating conditions (e.g., limits for overall current draw, operating temperature, etc.).

Similarly, identifying and disabling the post-deployment bad blocks decreases and/or eliminates potential voltage collapses that may occur during reset reads. In some embodiments (e.g., 3-dimensional NAND devices), for example, reset reads can be implemented to reduce error rates associated with reading the memory block after prolonged inactivity (i.e., "first page reads"). For implementing the reset reads, the memory device 100 can concurrently drive the word lines of a group of blocks (e.g., 8, 16, 32, etc.) to an internally generated voltage (e.g., around 6V). While the reset reads can interrupt the prolonged inactivity and mitigate the first page read issues, bad blocks can cause an effective short between the driven word line and ground. Accordingly, the internally generated voltage would collapse, causing the reset reads to fail. Thus, disabling the bad blocks reduces/eliminates the bad blocks from interfering with reset reads. Although described with reference to the breakdown of an insulator causing bad blocks, embodiments of the present disclosure have application to tracking bad blocks caused in other ways as well.

Figure 3:
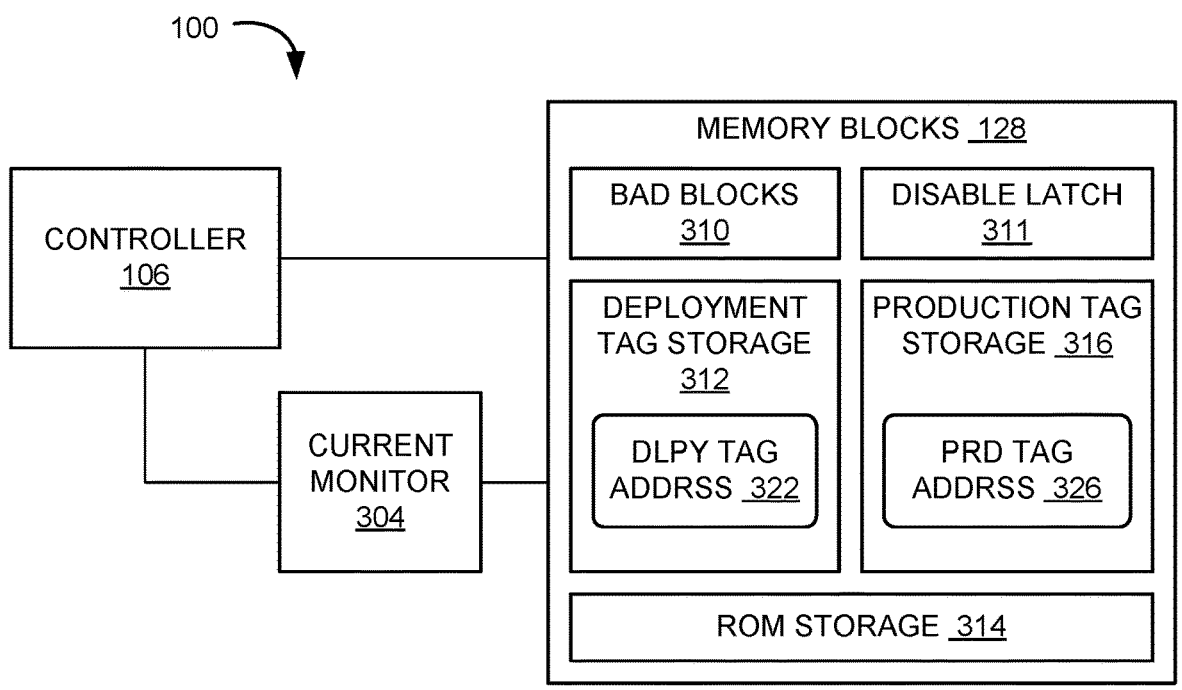
FIG. 3 is a functional block diagram of a memory device configured in accordance with an embodiment of the present technology.

FIG. 3 is a functional block diagram of a memory device (e.g., the memory device 100) configured in accordance with an embodiment of the present technology. The memory device 100 can include the memory blocks 128 (e.g., groupings of the memory cells 122 of FIG. 1) operably coupled to one or more current monitors 304. In some embodiments, the current monitors 304 can be included in the main memory 102 of FIG. 1.

The current monitors 304 can be configured to detect bad blocks 310 by measuring current (e.g., leakage current and/or standby current) for corresponding instances of the memory blocks 128, such as the memory blocks 128 that are connected to the word lines and/or accessed by the controller 106. When the measured current exceeds a predetermined threshold, the memory device 100 (e.g., the controller 106 and/or circuit internal to the main memory 102) can identify the corresponding memory blocks 128 as the bad blocks 310.

When the current monitor 304 detects excessive current, the controller 106, the current monitor 304 and/or one or more circuits internal to the main memory 102 can identify addresses of the bad blocks 310 and store them in deployment tag storage 312. In some embodiments, the deployment tag storage 312 can include one or more designated memory blocks configured to store deployment tag addresses 322 (i.e., the addresses of the bad blocks 310 that are formed post-deployment). In other embodiments, the deployment tag storage 312 can include a storage circuit outside of the memory blocks 128. Also, in some embodiments, the memory device 100 (e.g., within the main memory 102 and/or the memory blocks 128) can include disable latches 311 that can be set to disconnect and electrically isolate the bad blocks 310 from other circuits and/or the word lines.

In some embodiments, the deployment tag storage 312 can be separate from a ROM storage 314 and a production tag storage 316. For example, the ROM storage 314 and the production tag storage 316 can be memory blocks and/or circuits separate from the deployment tag storage 312. The ROM storage 314 can be configured to store trim information, such as programming voltages. The production tag storage 316 can be configured to store production tag addresses 326 that correspond to addresses of the bad blocks 310 that were formed defective and/or discovered as being defective before deployment. In other embodiments, the deployment tag storage 312 can be a portion within the ROM storage 314.

In some embodiments, the memory device 100 can disable the bad blocks that are tagged by a user (via, e.g., the host device 108 and/or the controller 106). For the tagging, the system 101 and/or the memory device 100 therein can be configured to communicate a command sequence for tagging and disabling the bad blocks. In some embodiments, the system 101 and/or the memory device 100 can use the same interface or the tagging operation as the read/write erase operations.

In one or more embodiments, the command sequence can include predetermined operational codes (opcodes) and/or SET feature commands. For example, to specify the blocks to be tagged, the user can dynamically (e.g., during runtime of the memory device 100) use the command sequence that includes an opcode (e.g., 'CMDxy'), followed by a block address, followed by an opcode ('CMDuv'). The first opcode can be command code (e.g., a newly defined code and/or a part of SET feature commands) for the tagging operation, the block address can be the deployment tag address 322 for the bad block, and the second opcode can be for confirming the tagging operation. In some embodiments, the predetermined opcodes can be similar to the read command in which the user initiates the command sequence with an opcode (e.g., 'CMD00'), followed by n cycles (e.g., 5 cycles) of the block and page address, which can be followed by confirmation (e.g., 'CMD30'). In other embodiments, the SET features can be based on a command sequence that includes an opcode (e.g., 'CMDef'), followed by a feature address (e.g., for bad block tagging), followed by n bytes (e.g., 4 bytes) of data specifying the bad block to be tagged. (e.g. 'CMDuv').

Based on the command sequence, the memory device 100 (via, e.g., a NAND internal circuitry, such as a state machine) can set the disable latch 311 associated with the identified bad block. In some embodiments, settings of the disable latches 311 may be volatile (i.e., settings may be lost if power supply is interrupted). Accordingly, in other embodiments, the deployment tag addresses 322 can be stored in the deployment tag storage 312 (e.g., non-volatile memory) and used to re-set the disable latches 311 across power supply interruptions.

In other embodiments, the user (via, e.g., the host device 108 and/or the controller 106) can program an extended bad block map that includes the deployment tag addresses 322. The extended bad block map can be stored in the deployment tag storage 312 (e.g., non-volatile memory). Upon issuance of FF (initialization) command, the NAND can read the map and disable the bad blocks using the disable latches 311. The user can read, erase, and program the extended bad block map to update for bad blocks that develop over time. An example command sequence for writing the map information can include a map program (PGM) command, followed by data, followed by a confirmation command. In response, the NAND can select the memory block designated as the deployment tag storage 312 and begin the programming operation to write the map using the data. Similarly, an example command sequence for erasing the map information can include a map erase command, followed by a null block address, followed by a confirmation command. Also, an example command sequence for reading the map information can include a map read command, followed by a null block address, followed by a confirmation command, which can be followed by a data output resulting from the read. The data output can be supplied to the disable latches 311 for disabling the bad blocks identified in the map.

The deployment tag storage 312, the deployment tag addresses 322, and/or the disable latches 311 provide improved robustness and reduced errors for the memory device 100. The deployment tag storage 312 and the deployment tag addresses 322 can be used to retain addresses of bad blocks as they develop during deployed lifetime of the memory device 100. With the deployment tag addresses 322, the disable latches 311 can disconnect the post-deployment bad blocks 310 from associated circuits, word lines, etc., similar to the bad blocks identified during production, such that the post-deployment bad blocks 310 cannot interfere with normal operations of the memory device 100. As such, the bad blocks 310 can be disabled to guard against accidental attempts by the user to access the bad blocks 310.

Further, when word line biasing and/or reset reads are utilized in the memory device 100, the deployment tag storage 312, the deployment tag addresses 322, and/or the disable latches 311 can provide increased stability and effectiveness for the operations. As described above, unless disabled, the post-deployment bad blocks 310 can effectively cause a short between the word lines and ground. By disabling/disconnecting the bad blocks, the memory device 100 can prevent the shorts, thereby ensuring correct/accurate implementation of the word line biasing and/or the reset read operations.

Figure 4:
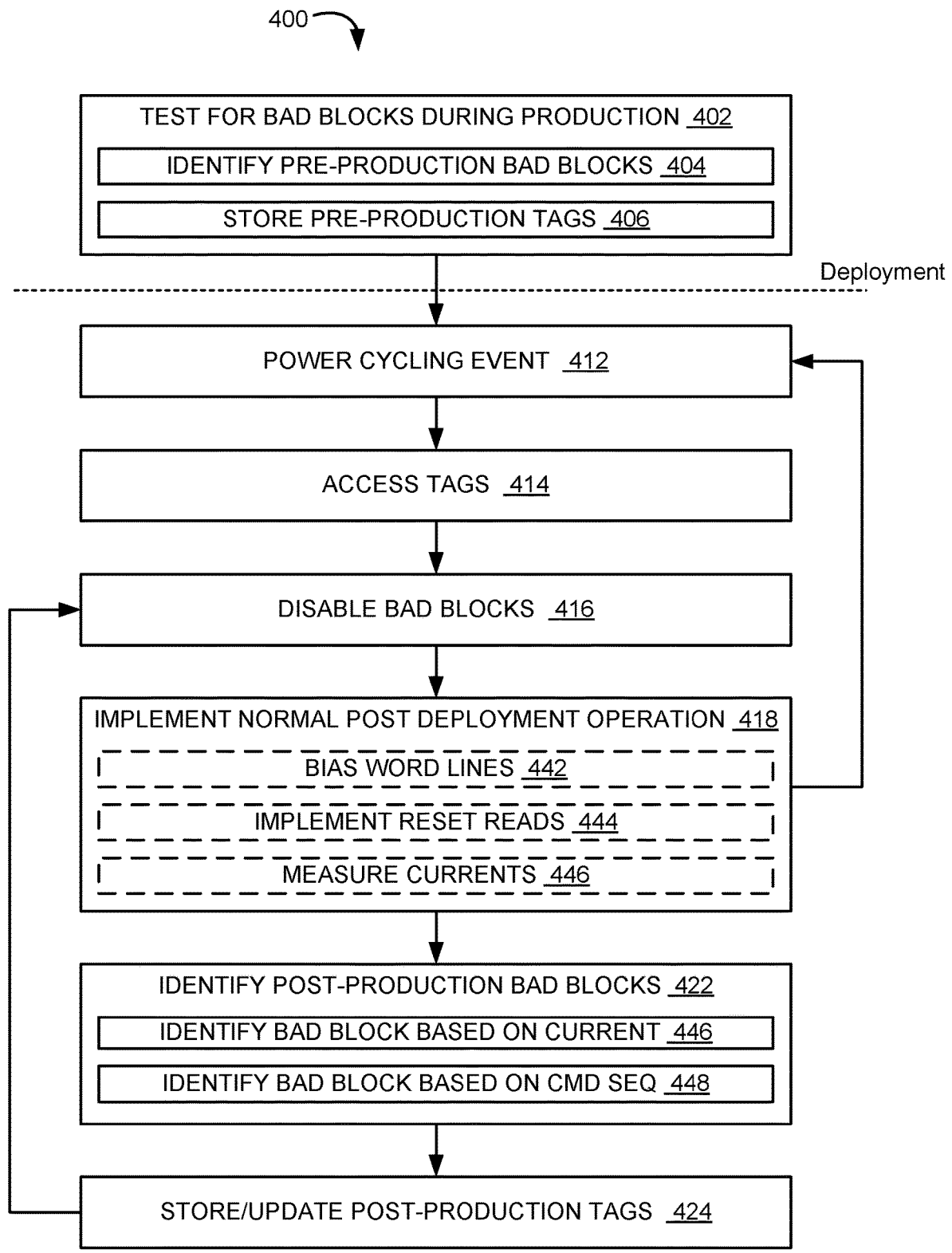
FIG. 4 is a flow diagram illustrating an example method of operating the memory system in FIG. 1 in accordance with an embodiment of the present technology.

FIG. 4 is a flow diagram illustrating an example method 400 of operating the system 101 of FIG. 1 and/or the memory device 100 of FIG. 1 in accordance with an embodiment of the present technology. The method 400 can include identifying and disabling the memory blocks that degrade after deployment of the memory device 100.

At block 402, the memory device 100 or components therein (e.g., dies) can be tested during production/manufacturing process. For example, silicon-level circuits for the memory array 200 of FIG. 2 can be tested during the manufacturing process, such as before assembly of the memory device 100. Also, for example, the memory device 100 can be tested after assembly thereof. At block 404, the existing bad blocks (i.e., existing/detected prior to deployment of the memory device 100) can be identified during the testing process. The testing process can identify the production tag addresses 326 of FIG. 3. At block 406, the addresses for the identified bad blocks (e.g., the production tag addresses 326) can be stored at a predetermined location (e.g., the production tag storage 316 of FIG. 3). In some embodiments, the identified bad blocks can be disabled/disconnected before deployment of the memory device 100.

Block 412 can represent power cycling events (by, e.g., turning power off and on and/or resetting the device/system) that occur as part of normal operation after deployment of the memory device 100. At block 414, the memory device 100 can access the tags that identify the bad blocks. In some embodiments, the memory device 100 can access the production tag storage 316 for the production tag addresses 326 and/or access the deployment tag storage 312 of FIG. 3 for the deployment tag addresses 322 of FIG. 3 that represent the (post-deployment) bad blocks 310 of FIG. 3 that occur or are generated after deployment. The tags can be accessed during initialization and/or reset of the memory device 100. In some embodiments, the accessed tags (e.g., the addresses to the bad memory blocks) can be provided to one or more circuits (e.g., the disable latches 311 of FIG. 3) for managing the bad blocks.

At block 416, the memory device 100 can disable the bad blocks according to the accessed tags. The memory device 100 (via, e.g., the controller 106 of FIG. 1 and/or the main memory device 102) can disable the bad blocks 310 for preventing access thereof during subsequent operations of the memory device 100. In some embodiments, for example, the memory device 100 can control the disable latches 311 associated with the accessed tags to disconnect the bad blocks 310 from other circuits and/or the corresponding word lines. Accordingly, the memory device 100 can electrically isolate the bad blocks 310 from other circuits and/or one or more corresponding word lines. Disconnecting the bad blocks 310 can prevent voltages (e.g., from word line biasing and/or reset reads) from being shorted to ground through defective paths within the bad blocks 310.

As mentioned in detail below, the memory device 100 can disable the bad blocks 310 in real-time following a detection/identification of a bad block that developed during post-deployment operation of the memory device 100. For example, the memory device 100 can disable the bad blocks 310 based on autonomously (e.g., without interacting with the controller 106 and/or the host device 108) detecting and implementing the process described above to disable the bad blocks 310. Also, the memory device 100 can disable the bad blocks 310 based on implementing the command sequence described above.

At block 418, the memory device 100 can implement normal post deployment operations, such as for reading, writing, and/or erasing data. In some embodiments, as illustrated at block 442, the memory device 100 can bias one or more of the word lines to a predetermined non-zero voltage level during standby mode as described above. In some embodiments, as illustrated at block 444, the memory device 100 can implement reset reads as described above. For example, the memory device 100 can track an elapsed time measured from last access to a memory location and implement the reset read prior to implementing a read command when the elapsed time exceeds a threshold. For the reset reads, the memory device 100 can provide a non-zero voltage to a set of the word lines for interrupting prolonged inactivity for the memory blocks. Disabling/disconnecting the bad blocks 310 can prevent the word lines from shorting to ground through degraded memory cells, thereby enabling the word line biasing and/or the reset reads to function properly and reducing associated errors.

In some embodiments, as illustrated at block 446, the memory device 100 (via, e.g., the current monitor 304 of FIG. 3) can measure currents associated with the memory blocks 128 of FIG. 3 during post-deployment operation. For example, the memory device 100 can measure the current consumption through the word lines for detecting occurrences of the bad blocks 310. In some embodiments, when the word lines are biased, increased current consumption can be caused when memory cells degrade (thereby forming bad blocks 310).

At block 422, the memory device 100 can identify post-production bad blocks (e.g., the bad blocks 310). For example, the memory device 100 can identify the bad blocks 310 based on the measured current and/or the command sequence.

In some embodiments, as illustrated at block 446, the memory device 100 can identify the bad blocks based on the measured current. For example, the memory device 100 and/or the memory blocks 128 therein can compare the monitored current levels to a predetermined threshold and generate a flag when the current levels match and/or exceed the predetermined threshold. The memory device 100 (via, e.g., the controller 106, the current monitor 304, and/or the memory blocks 128) can identify the bad block and/or an address thereof based on the current measure. For example, the memory device 100 can identify the deployment tag address 322 as the address of the memory block being accessed and/or connected to the word line when the flag is triggered.

At block 424, the identified address (e.g., the deployment tag address 322) can be stored in the deployment tag storage 312. The memory device 100 can store the deployment tag addresses 322 at a location (e.g., one or more designated memory blocks and/or a set of storage circuits) that is separate from the production tag storage 316 and/or the ROM storage 314 of FIG. 3. In some embodiments, for example, the deployment tag address 322 can be stored in a portion in the ROM storage 314 designated as the deployment tag storage 312. Accordingly, the ROM storage 314 can store the deployment tag address 322 along with trim data used for reading and/or writing data. In other embodiments, the deployment tag address 322 can be stored in the deployment tag storage 312 that is separate from both the production tag storage 316 and the ROM storage 314. In some embodiments, the deployment tag addresses 322 can be tracked using the extended bad block map as described above.

The identified address can be used to disable the corresponding bad block 310 as illustrated at block 416. In some embodiments, the memory device 100 can autonomously identify and disable the bad block at the memory device 100 and/or at the memory array 302 based on the measured current without interacting with an external device (e.g., the host device 108 and/or the controller 106, respectively). In other embodiments, the memory device 100 can report the deployment tag address 322 and interact with the user (via, e.g., the controller 106 and/or the host device 108) to disable the bad blocks 310. For example, the memory device 100 can receive and implement the command sequence to disable the bad blocks 310 as described above. Also, the stored addresses can be used to keep the bad blocks 310 disabled across power cycling events illustrated at block 412. Accordingly, the memory device 100 can access/read the deployment tag addresses 322 during or following initialization and/or reset of the memory device 100 and disable the bad blocks 310 as described above.

Figure 5:
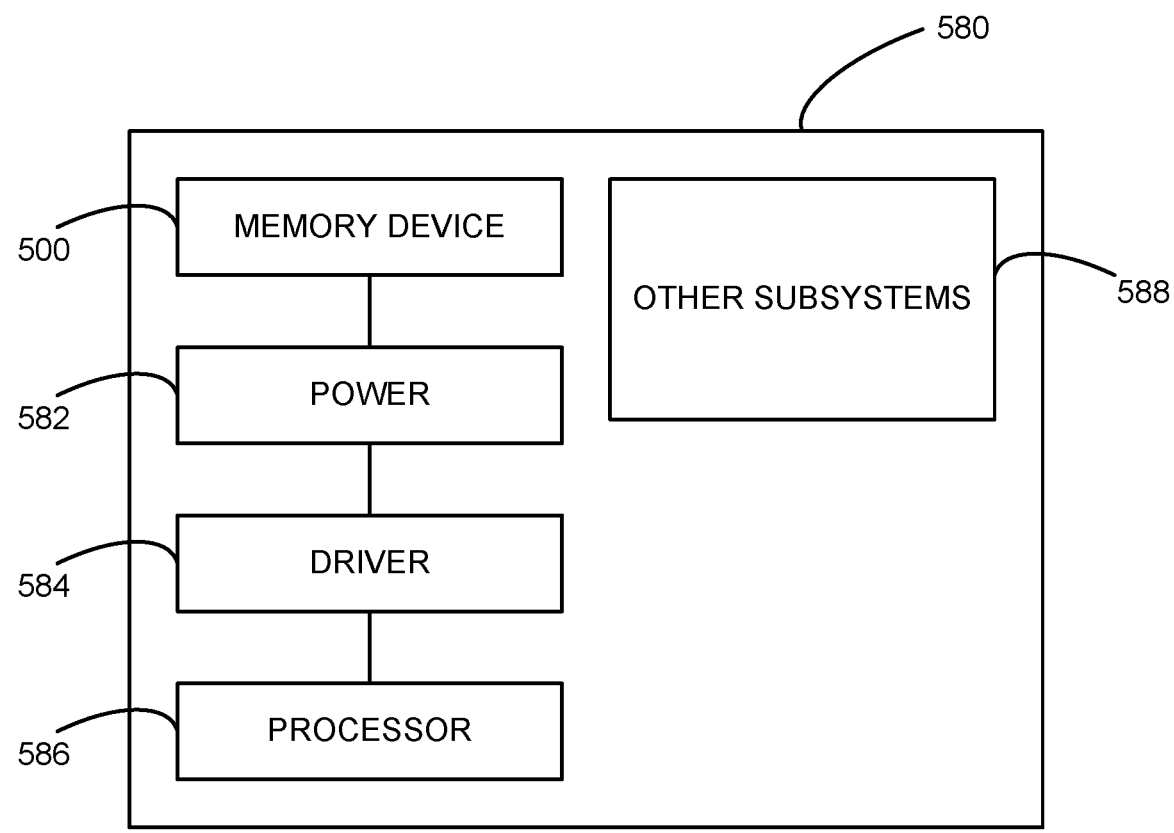
FIG. 5 is a schematic view of a system that includes a memory device in accordance with an embodiment of the present technology.

FIG. 5 is a schematic view of a system that includes a memory device in accordance with embodiments of the present technology. Any one of the foregoing memory devices described above with reference to FIGS. 1-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588. The memory device 500 can include features generally similar to those of the memory device described above with reference to FIGS. 1-4, and can therefore include various features for performing a direct read request from a host device. The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

We claim:

1. A memory device, comprising:
   a memory array including:
      memory blocks each having a plurality of memory cells configured to store data;
      one or more current monitors configured to determine a measure of current during post-deployment operation of the memory device; and
   a controller coupled to the memory array, the controller configured to:
      identify a bad block within the memory blocks based on the determined measure of current;
      disable the bad block to prevent access thereto during subsequent operations of the memory device; and
      implement a reset read before a read command for interrupting prolonged inactivity for one or more of the memory blocks associated with the read command;
   wherein:
   the controller and/or the memory array is configured to isolate the bad block from a non-zero bias voltage associated with accessing the data.

2. The memory device of claim 1, wherein:
   the controller is configured to identify a deployment tag address for the bad block; and
   further comprising:
   a read-only-memory (ROM) configured to store the deployment tag address along with trim data used for reading and/or writing data, wherein the deployment tag address is accessed by the controller following a reset of the memory device for preventing the access to the bad blocks.

3. The memory device of claim 1, further comprising:
   a production tag storage configured to store a production tag address;
   a deployment tag storage configured to store a deployment tag address for the bad block, wherein the deployment tag address is accessed by the controller following a reset of the memory device for preventing the access to the bad blocks; and
   wherein the controller is configured to:
   identify the deployment tag address for the bad block based on the determined measure of current, and
   access the production tag address and the deployment tag address following the reset of the memory device for preventing the access to the corresponding blocks.

4. The memory device of claim 3, wherein:
   the production tag address represents one of the memory blocks that was discovered to be defective prior to deployment of the memory device; and the deployment tag address represents the bad block that was discovered to be defective after deployment of the memory device.

5. The memory device of claim 1, wherein the memory array includes one or more designated memory blocks configured to store a deployment tag address for the bad block, wherein the deployment tag address is for preventing the access to the bad blocks.

6. The memory device of claim 1, wherein the memory array includes a disable latch coupled to the one or more memory blocks and configured to disable the bad blocks based on disconnecting the bad blocks from one or more corresponding word lines and/or other memory blocks in the memory device, wherein the disable latch is volatile and resets based on interruptions in received power.

7. The memory device of claim 1, wherein the controller is configured to:
communicate a command sequence for interacting with a host device coupled to the memory device; and
disable the bad blocks based on the command sequence.

8. The memory device of claim 7, wherein the command sequence includes a SET feature command.

9. The memory device of claim 1, wherein:
the memory array includes word lines connected to the memory blocks and configured to provide access to the connected memory blocks; and
the memory array is configured to bias one or more of the word lines to the non-zero bias voltage while the corresponding memory blocks are in standby mode; and
the controller and/or the memory array is configured to isolate the bad block from one or more corresponding word lines for preventing the non-zero bias voltage from being shorted to ground through defective paths within the bad block.

10. The memory device of claim 1, wherein:
the memory array includes word lines connected to the memory blocks and configured to provide access to the connected memory blocks; and
the controller is configured to:
track an elapsed time measured from last access to a memory location;
implement the reset read prior when the elapsed time exceeds a threshold, wherein implementing the reset read includes providing a non-zero voltage to a set of the word lines; and
isolate the bad block from the set of the word lines for preventing the provided voltage from being shorted to ground through defective paths within the bad block.

11. A memory system, comprising:
a host device; and
a memory device coupled to the host device, wherein:
the memory device includes memory blocks each with a plurality of memory cells configured to store data, and
the memory device is configured to:
determine a measure of current during post-deployment operation of the memory device;
identify a bad block within the memory blocks based on the determined measure of current;
disable the bad block for preventing access thereto during subsequent data operations;
implement a reset read before a read command for interrupting prolonged inactivity for one or more of the memory blocks associated with the read command; and
isolate the bad block from a non-zero bias voltage associated with accessing the data.

12. The memory system of claim 11, wherein:
the memory device is configured to:
identify the bad block,
report the bad block when the determined measure of current meets or exceeds a threshold, and
disable the bad block based on interacting with the host device; and
the host device is configured to:
receive report of the bad block from the memory device, and
implement a command sequence for sending a SET feature command to disable the bad block.

13. The memory system of claim 11, wherein the memory device is configured to autonomously identify and disable the bad block based on the determined measure of current without interacting with the host device.

14. The memory system of claim 11, wherein the memory device is a flash memory device.

15. The memory system of claim 14, wherein the flash memory device is a NAND device.

16. A method of operating a memory device including a controller and a memory array that includes memory blocks each having a plurality of memory cells configured to store data, the method comprising:
determining a measure of current consumption for one or more of the memory blocks during post-deployment operation of the memory device;
identifying a bad block within the memory blocks based on the determined measure of current consumption;
disabling the bad block to prevent access thereto during subsequent operations of the memory device; and
isolating the bad block from a non-zero bias voltage; and
implementing a reset read when an elapsed time measured from last access to a memory location exceeds a threshold.

17. The method of claim 16, wherein:
identifying the bad block includes identifying an address of the bad block;
further comprising:
storing the address of the bad block; and
providing the address to a disabling circuit during following a reset of the memory device.

18. The method of claim 17, wherein storing the address of the bad block includes storing the address in one or more of the memory blocks designated for storing address of blocks that become defective after deployment of the memory device.

19. The method of claim 17, wherein storing the address of the bad block includes storing the address in a read-only-memory (ROM) configured to store the address along with trim data used for reading and/or writing data for the memory array.

20. The method of claim 16, wherein disabling the bad block includes operating a disable latch coupled to the bad block to disconnect the bad block from one or more corresponding word lines and/or other memory blocks in the memory device.

* * * * *